(12) United States Patent
Wu et al.

(10) Patent No.: US 8,792,589 B2
(45) Date of Patent: Jul. 29, 2014

(54) SYSTEM AND METHOD FOR PROTECTING TRANSMISSIONS OF WIRELESS MICROPHONES OPERATING IN TELEVISION BAND WHITE SPACE

(75) Inventors: Shiquan Wu, Nepean (CA); Vajira Samarasooriya, Ottawa (CA)

(73) Assignee: Wi-LAN Inc., Ottawa, Ontario (CA)

( * ) Notice: Subject to any disclaimer, the term of this patent is extended or adjusted under 35 U.S.C. 154(b) by 1092 days.

(21) Appl. No.: 12/779,782

(22) Filed: May 13, 2010

(65) Prior Publication Data

US 2011/0280413 A1 Nov. 17, 2011

(51) Int. Cl.
*H04N 5/455* (2006.01)
(52) U.S. Cl.
USPC ............ 375/316; 348/725; 348/726; 348/731
(58) Field of Classification Search
USPC .......... 375/316, 377; 348/725, 726, 731, 732, 348/180, 184, 194; 455/226.1, 226.2
See application file for complete search history.

(56) References Cited

U.S. PATENT DOCUMENTS

| 6,366,621 | B1 * | 4/2002 | Kuntz et al. | 375/321 |
|---|---|---|---|---|
| 6,417,890 | B1 * | 7/2002 | Welles et al. | 348/614 |
| 6,944,241 | B1 | 9/2005 | Oh | |
| 2004/0106398 | A1 * | 6/2004 | Statham et al. | 455/420 |
| 2006/0088010 | A1 * | 4/2006 | Buchwald et al. | 370/338 |
| 2008/0010208 | A1 * | 1/2008 | Callaway | 705/57 |
| 2008/0165680 | A1 * | 7/2008 | Chang | 370/230 |
| 2009/0102981 | A1 | 4/2009 | Mody | |
| 2009/0143019 | A1 * | 6/2009 | Shellhammer | 455/67.11 |
| 2010/0022205 | A1 | 1/2010 | Henry | |
| 2010/0189273 | A1 | 7/2010 | Statham et al. | |
| 2011/0043710 | A1 | 2/2011 | Samarasooriya et al. | |
| 2011/0169965 | A1 * | 7/2011 | Kim et al. | 348/181 |

FOREIGN PATENT DOCUMENTS

WO 2011036223 A1 3/2011

OTHER PUBLICATIONS

Guanbo Zheng, Ning Han, Xiaoge Huang, Sung Hwan Sohn and Jae Moung Kim, "Enhanced Energy Detector for IEEE 802.22 WRAN Systems Using Maximal-to-Mean Power Ratio ", Inha University, South Korea, 2007, IEEE.*
Ser Wah Oh, Syed Naveen A. A., Yonghong Zeng, V. P. Kumar, T. P. C. Le, Karen J. M. Kua and Weigiang Zhang, "White-Space Sensing Device for Detecting Vacant Channels in TV Bands ", Institute for Infocomm Research, Singapore, May 2008, IEEE.*
Monisha Ghosh, Vasanth Gaddam, Gene Turkenich and Kiran Challapali, "Spectrum Sensing Prototype for Sensing ATSC and Wireless Microphone Signals", Philips Research North America, May 2008, IEEE.*
Sunmin Lim, Sangwon Kim, Changhyun Park, Myungsun Song, "The detection and classification of the Wireless Microphone signal in the IEEE 802.22 WRAN system", Electronics and Telecommunications Research Institute, Republic of Korea, Dec. 2007, IEEE.*

(Continued)

*Primary Examiner* — Aristocratis Fotakis
(74) *Attorney, Agent, or Firm* — Procopio, Cory, Hargreaves & Savitch LLP

(57) ABSTRACT

A wireless microphone system broadcasts a pilot tone at the designated ATSC pilot position in the TV Band channel being used by the wireless microphone system. The pilot tone is a readily detectable waveform transmitted in the ATSC pilot position. The pilot tone can be generated by any one of: a standalone pilot tone generator; a pilot tone generator incorporated into a wireless microphone receiver; or, a pilot tone generator incorporated into a wireless microphone.

7 Claims, 10 Drawing Sheets

(56) References Cited

OTHER PUBLICATIONS

Wen Gao, Hou-Shin Chen, Monisha Ghosh and Steve Shellhammer, IEEE 802.22-07/0268r2, Text on ATSC Signature Sequence Correlation—for Informative Annex on Sensing Techniques, Thompson Inc, Philips and Qualcomm, Jun. 14, 2007.*

International Search Report and Written Opinion issued on Nov. 28, 2011, in corresponding application No. PCT/CA2011/050274, 9 pages.

Extended European Search Report for related EP Patent Application No. 11791794.8, dated Jan. 8, 2014, in 6 pages.

* cited by examiner

SYSTEM AND METHOD FOR PROTECTING TRANSMISSIONS OF WIRELESS MICROPHONES OPERATING IN TELEVISION BAND WHITE SPACE

RELATED APPLICATIONS

This is the first application filed for this invention.

FIELD OF THE INVENTION

This invention relates in general to the secondary use of television (TV) band channels and, in particular, to a system and method for protecting the transmissions of wireless microphone systems operating in the television band (TV Band).

BACKGROUND OF THE INVENTION

The opening of available TV Band spectrum for usage by secondary TV Band devices has created a need for efficient spectrum sensing mechanisms that can reliably detect available TV Band white spaces to ensure that primary users such as digital television (DTV) broadcasters and wireless microphones are protected from interfering broadcasts by the TV Band devices.

Sensing available white spaces in the VHF/UHF bands is vital to the operation of secondary TV Band devices. Protection of primary incumbent operators like digital television (DTV) stations and wireless microphone operators is mandated by the United States Federal Communications Commission (FCC) and other federal authorities around the world. The DTV and wireless microphone sensing requirements set forth by the FCC are very stringent, requiring a sensing threshold setting of −114 dBm. Acquiring and sensing signals from VHF/UHF channels at the required sensing threshold are very challenging. None of the known technologies currently being tested are capable of meeting that sensing threshold.

IEEE 802.22.1 proposed that every wireless microphone transmit a "beacon" in the form of a direct sequence spread spectrum signal to indicate that the wireless microphone is in operation. This solution requires that each TV Band device be equipped with a complex receiver/detector capable of detecting the spread spectrum beacon signal. This solution will therefore increase the cost of both TV Band devices and wireless microphone transmitters.

As understood by those skilled in the art, an Advanced Television Systems Committee (ATSC) TV signal is created using an MPEG encoder to convert digitized video data into a high speed (19.39 Mbits/second) bit stream, which is passed to a DTV circuit that adds framing information and randomizes the data to "smooth" it out. The framed data stream is then encoded and a series of synchronization signals is inserted into it (Segment-sync, Field-sync, and ATSC Pilot) to provide a signal that is applied to an 8-VSB (8-Level-Vestigial Side Band) modulator, which outputs a baseband DTV signal. Finally, the baseband DTV signal is mixed with a carrier signal to "up-convert" it to a desired channel or frequency. The up-converted DTV signal typically occupies 5.38 MHz spectrum, thereby being confined to within 90% of the 6 MHz DTV Band channel allocation.

The ATSC pilot is a constant DC value at the baseband and becomes a single tone at radio frequency (RF) occupying a fixed location within the transmitted 6 MHz channel. The ATSC pilot has constant amplitude (normalized value of 1.25 on the 8-Level-Vestigial Side Band scale). So, if an ATSC pilot is detected, the channel is declared occupied by a DTV signal. If the DTV signal is denoted by sTV(t), the transmitted signal tTV(t) includes sTV(t), and the ATSC pilot sPilot(t). The signal received by a white space detector, denoted by r(t), includes $\alpha\{sTV(t)+sPilot(t)\}$, where $\alpha$ is a factor that represents impairments introduced by the communication channel.

The ATSC pilot can be detected, for example, if the RF signal received from a selected DTV channel is frequency converted to baseband and subsequently narrowband filtered around the DC component thereof, in a manner well known in the art. The energy in the filtered signal can be analyzed to determine the presence, or absence, of the ATSC pilot, which provides a reliable indication of the presence, or absence, of a DTV signal.

Alternatively, the signal received from the selected DTV channel can be filtered and frequency translated to an intermediate frequency band. The presence, or absence, of the pilot signal can then be determined by accumulating and analyzing the received signal energy within the narrow frequency band that the DTV pilot signal is mandated to occupy.

A wireless microphone (WM) normally transmits a frequency modulated (FM) waveform $s_{mic}(t)$, which can be mathematically expressed as:

$$s_{mic}(t) = A \cos(2\pi f_m t + 2\pi k_m \int_{-\infty} m(x) dx) \qquad \text{eq. 1}$$

Where: A is the amplitude; fm is the carrier frequency; m(x) is the message signal; and, $k_m$ is a scaling factor.

The wireless microphone FM waveform has no known sequence or pattern to facilitate sensing. Most wireless microphone signals occupy a bandwidth of 200 kHz or less. As understood by those skilled in the art, the FM waveform may swing back and forth within the 200 kHz bandwidth. Furthermore, wireless microphone receivers need to be protected from interference from signals transmitted by TV Band device transmitters. A wireless microphone typically requires a desired-to-undesired signal power ratio of 20 dB or more for operation. Therefore, in order to keep interference from TV Band device transmitters within acceptable limits, wireless microphone transmissions will have to be detected at levels even lower than the sensing threshold of −114 dBm. Consequently, reliably detecting and protecting wireless microphone systems is extremely difficult.

There therefore exists a need for a viable way to reliably detect the presence of a wireless microphone system at reasonable cost.

SUMMARY OF THE INVENTION

It is therefore an object of the invention to provide a system and a method for protecting the transmissions of wireless microphones operating in a TV Band channel.

The invention therefore provides a method of protecting transmissions of a wireless microphone system operating in a television (TV) band channel, the method comprising: broadcasting a pilot tone from the wireless microphone system, the pilot tone being broadcast within a frequency band of the TV Band channel used by the wireless microphone system at a location in the frequency band mandated for an Advanced Television Systems Committee (ATSC) pilot for a digital television (DTV) broadcast, to permit a TV Band device to detect the pilot tone in order to determine that the TV Band channel is in use by the wireless microphone system.

The invention further provides a method of determining whether a TV Band channel is available for use by a TV Band device, comprising: tuning to the TV Band channel; down-converting a radio frequency signal received on the TV Band channel to yield a down-converted signal; performing a predetermined number of Fast Fourier Transforms (FFTs) on the down-converted signal and accumulating an energy of respective bins associated with the respective FFTs; selecting a predetermined number of FFT bins centered at a mandated location of an Advanced Television Systems Committee (ATSC) pilot in the TV Band channel; and analyzing the selected FFT bins to determine if an energy spike is present in any one of the selected FFT bins.

The invention yet further provides a wireless microphone system, comprising: a pilot tone generator that generates a pilot tone and broadcasts the pilot tone within a frequency band of a TV Band channel used by the wireless microphone system; wherein the pilot tone is broadcast at a location in a frequency band designated for an Advanced Television Systems Committee (ATSC) pilot in the TV Band channel, to permit a TV Band device to detect the pilot tone in order to determine whether the TV Band channel is in use by the wireless microphone system.

The invention yet further provides a wireless microphone receiver, comprising a pilot tone generator adapted to generate a pilot tone of a predetermined waveform and to broadcast the pilot tone at a frequency location designated for an Advanced Television Systems Committee (ATSC) pilot in a TV Band channel used by a wireless microphone system with which the wireless microphone receiver is associated.

The invention yet further provides a pilot tone generator for a wireless microphone system that generates a pilot tone of a predetermined waveform and broadcasts the pilot tone at a frequency location mandated for an Advanced Television Systems Committee (ATSC) pilot in a TV Band channel used by the wireless microphone system.

The invention yet further provides a wireless microphone of a wireless microphone system, comprising: a pilot tone generator adapted to generate a pilot tone of a predetermined waveform at a frequency designated for an Advanced Television Systems Committee (ATSC) pilot in a TV Band channel used by the wireless microphone system; a signal combiner that combines the pilot tone with a frequency modulation (FM) signal generated by the wireless microphone to create a combined signal; and a combined signal transmitter that broadcasts the combined signal received by a wireless microphone receiver of the wireless microphone system.

The invention yet further provides a TV Band device, comprising a pilot sensor adapted to detect a predetermined waveform broadcast by a wireless microphone system at a frequency location designated for an Advanced Television Systems Committee (ATSC) pilot in a TV Band channel used by the wireless microphone system.

BRIEF DESCRIPTION OF THE DRAWINGS

The invention will now be described by way of example only and with reference to the following drawings, in which.

DETAILED DESCRIPTION OF THE PREFERRED EMBODIMENTS

The invention provides a system and a method of protecting wireless microphone systems that use television band channels. In accordance with the invention a wireless microphone system broadcasts a pilot tone at the designated ATSC pilot position in the TV Band channel being used to broadcast the wireless microphone FM signal. The pilot tone may be a simulated ATSC pilot or another easily detectable waveform transmitted in the ATSC pilot position. The pilot tone can be generated by any one of: a stand-alone pilot tone generator; a pilot tone generator incorporated into a wireless microphone receiver; or, a pilot tone generator incorporated into a wireless microphone. If a stand-alone pilot tone generator is used, the wireless microphone requires no modification and the wireless microphone receiver only requires an addition of a mechanism, a band pass filter for example, to eliminate the pilot tone from the received signal. This significantly simplifies the detection of the presence of a wireless microphone system by TV Band devices, and helps ensure that wireless microphone systems are protected from interfering TV Band device transmissions. Cost is reduced because incumbent white space sensor circuits in TV Band devices can be used to reliably detect wireless microphone transmissions without modification.

Figure 1:
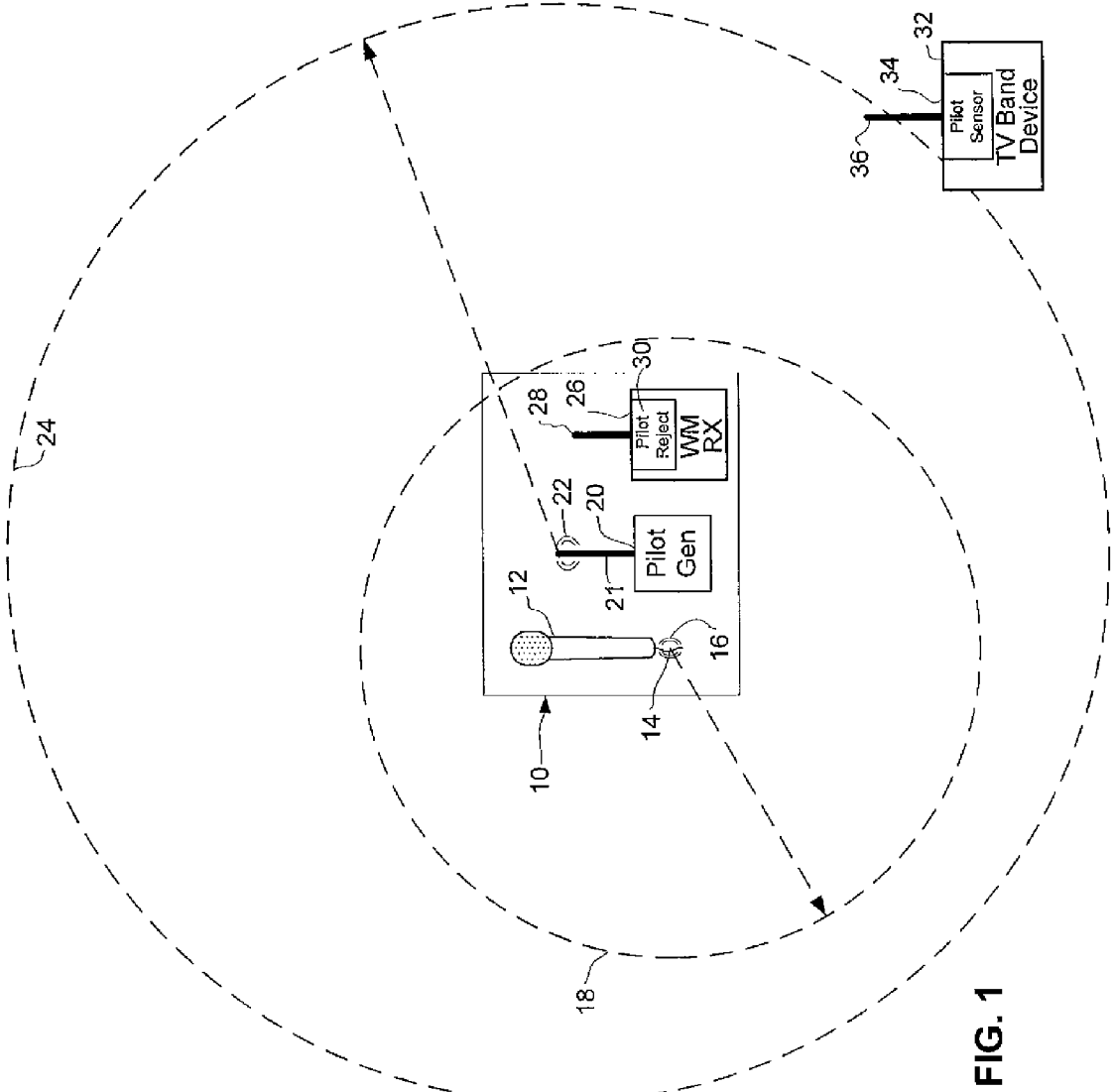
FIG. 1 is a schematic diagram of a wireless microphone system in accordance with one embodiment of the invention.

FIG. 1 is a schematic diagram of a wireless microphone system 10 in accordance with one embodiment of the invention. In this embodiment, the wireless microphone system (WMS) 10 includes a wireless microphone (WM) 12 of any known type, make or origin. The WM 12 has an antenna 14 that transmits an FM signal 16 in a manner well known in the art. As understood by those skilled in the art, the antenna 14 may be an internal or an external antenna. The WM 12 typically transmits the FM signal 16 at about 10 mW transmit power. The FM signal has a coverage area 18 that generally gives the WM 12 an effective range of about 100 m, depending on environmental factors.

A pilot tone generator 20, which generates a pilot tone (a simulated ATSC pilot or a similar easily detected waveform) and broadcasts the pilot tone at the designated ATSC pilot position, i.e. 309.441 kHz from the lower frequency edge of the 6 MHZ DTV Band channel assigned to the wireless microphone system 10. In one embodiment of the invention, the pilot tone generator 20 uses a modulating sequence to generate the pilot tone at radio frequency (RF), as will be explained below with reference to FIGS. 4 and 5. The pilot tone generator 20 has an antenna 21 that broadcasts the pilot tone 22. The transmit power used to broadcast the pilot tone 22 is regulated by FCC 47 C.F.R. Part 74, which dictates that the transmit power cannot exceed 50 mW in the VHF band or 250 mW in the UHF band. Thus the transmit power of the pilot tone generator 20 can be regulated so that the coverage area 24 of the pilot signal is greater than the coverage area 18 of the WM 12. Consequently, a TV Band device 32 with a pilot sensor 34 within the coverage area 24 can detect the pilot tone 22 and determine that the TV Band channel used by the WM 12 is occupied, even if the TV Band device 32 cannot detect the FM signal 16.

A wireless microphone receiver (WM RX) 26 of the WMS 10 in accordance with the invention receives the FM signal 16 and the pilot tone 22 via an antenna 28. A pilot tone reject mechanism 30, a band pass filter for example, removes the pilot tone 22 from the received signal, which is then processed in a normal manner well known in the art. The WM 12 can transmit the 200 kHz FM signal anywhere within the 6 MHZ TV Band channel except the bandwidth occupied by the pilot tone.

Figure 2:
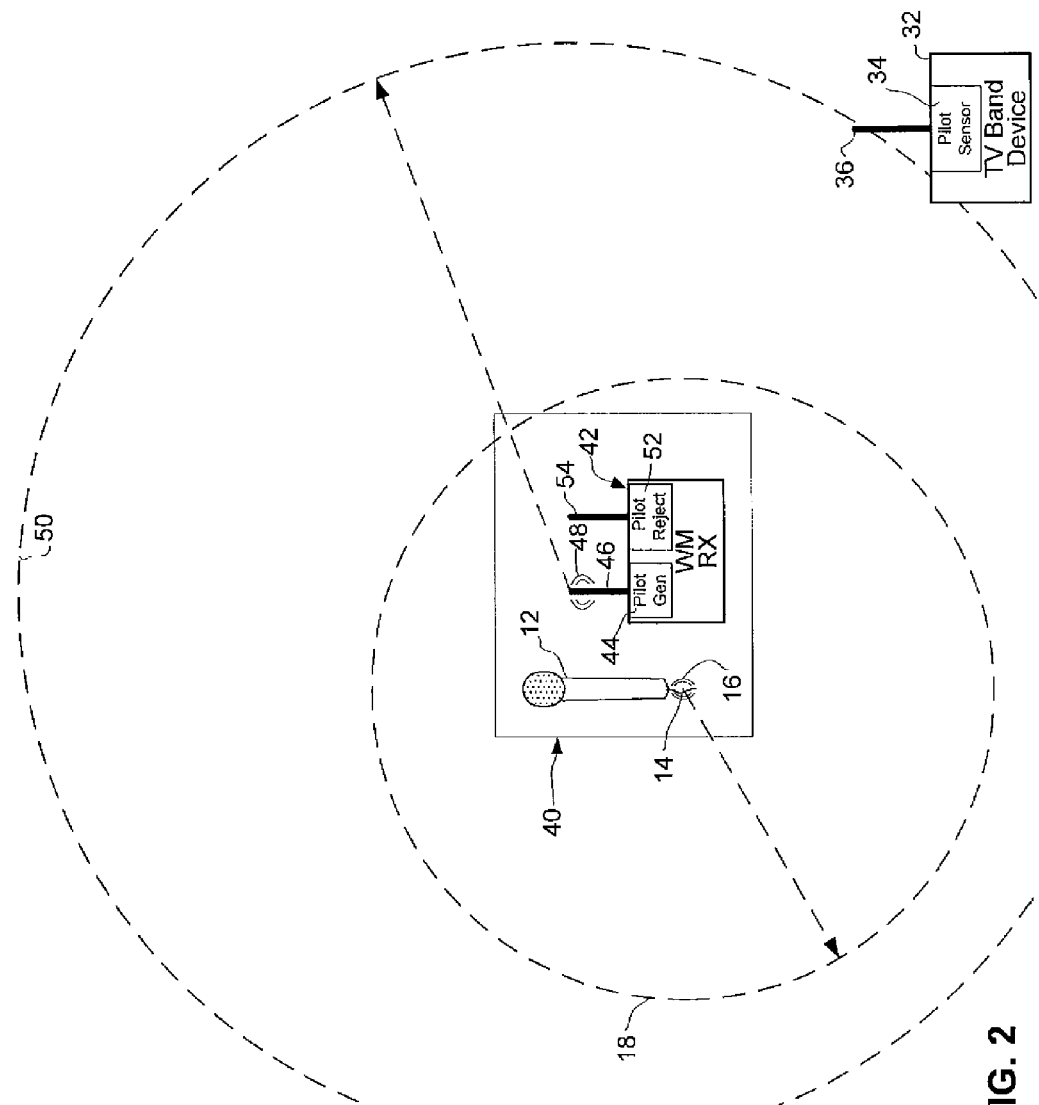
FIG. 2. is a schematic diagram of a wireless microphone system in accordance with another embodiment of the invention.

FIG. 2 is a schematic diagram of a WMS 40 in accordance with another embodiment of the invention. The WMS 40 is similar to the WMS 10 described above. However, a WM RX 42 includes a pilot tone generator 44 that generates the pilot tone. The pilot tone 48 is broadcast by an antenna 46 at a transmit power that gives the pilot tone a coverage area 50, which may be larger than the coverage area 18 of the WM 12. The WM RX 42 also has a receive antenna 54 which receives the FM signal 16 as well as the pilot tone 48, and a pilot tone reject mechanism 52 that removes the pilot tone 48 from the received signal, which is then processed in a normal manner well known in the art and explained above.

Figure 3:
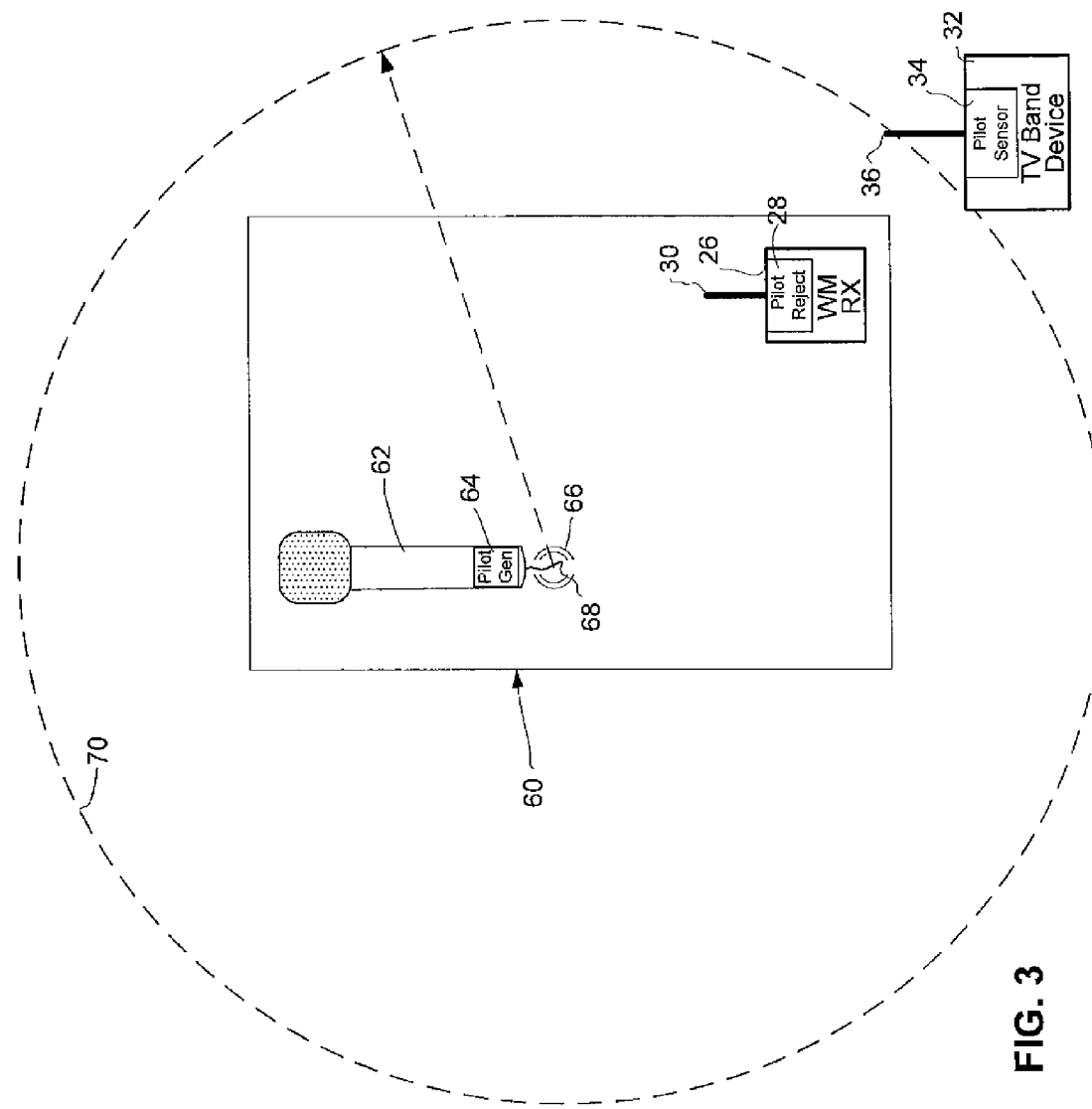
FIG. 3 is a schematic diagram of a wireless microphone system in accordance with yet a further embodiment of the invention.

FIG. 3 is a schematic diagram of a WMS 60 in accordance with yet a further embodiment of the invention. In this embodiment, a WM 62 includes a pilot tone generator 64 that generates the pilot tone, which is combined with the FM signal as will be described below in more detail with reference to FIG. 8. The combined signal 66 is broadcast by an antenna 68, which may be an external or an internal antenna of any type know in the art. The combined signal is broadcast at a transmit power of up to 50 mw, for example, to provide a range of coverage 70. The WM RX 26 in the WMS 60 is the same as the one described above with reference to FIG. 1.

Figure 4:
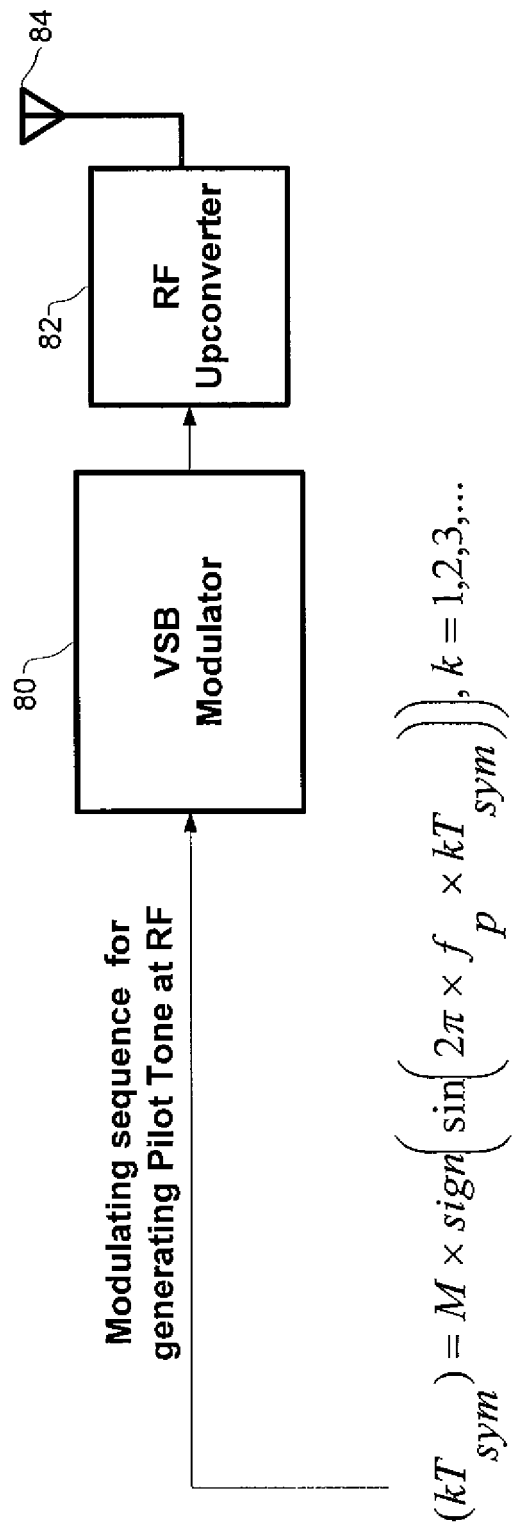
FIG. 4 is a schematic diagram illustrating an apparatus for generating a pilot tone at the ATSC pilot position in accordance with one embodiment of the invention.

FIG. 4 is a schematic diagram illustrating an apparatus for generating a pilot tone at the ATSC pilot position in accordance with one embodiment of the invention. The pilot tone is defined at baseband by the following sequence:

$$\{b\} = \{M, -M, M, -M, M, -M, M \ldots\} \quad \text{eq. 2}$$

Where, M is a constant value whose sign is changed according to a predetermined sequence every Tp second. The value of Tp, and the pattern of the sign change are design parameters that are respectively a matter of design choice. In accordance with one embodiment of the invention, M=1, which is useful for differentiating a pilot tone broadcast by a wireless microphone system from the pilot tone of a DTV broadcast.

In accordance with the invention, when a wireless microphone site is in operation one of: the pilot tone generator 20 (FIG. 1); the wireless microphone receiver 42 (FIG. 2); and, the wireless microphone 62 (FIG. 3) transmits a pilot tone modulated by sequence {b} at the ATSC pilot position within the TV Band channel being used for the FM transmissions of the wireless microphone(s) in the wireless microphone system.

If the ATSC symbol rate is denoted as $f_{sym}$:

$$f_{sym} = 4.5 \times \frac{684e06}{286} = 10.762 \frac{Msym}{s} \quad \text{eq. 3}$$

Denoting the symbol period $$T_{sym} = \frac{1}{f_{sym}}$$

the ATSC symbol stream out of the bits-to-symbol mapper is represented as:

$$a(kT_{sym}), k=0,1,2,3,\ldots \quad \text{eq. 4}$$

In the ATSC transmitter, a pilot DC value is added to this sequence as follows:

$$c((kT_{sym})) = a((kT_{sym})) + 1.25, k=0,1,2,3,\ldots \quad \text{eq. 5}$$

The sequence $c(kT_{sym})$, is fed to a Vestigial Side Band (VSB) modulator and the constant DC value of 1.25 becomes the DTV pilot at the RF output.

As explained above, in accordance with one embodiment of the invention the pilot tone broadcast by a wireless microphone system is defined by a sequence $b(kT_{sym})$, k=1, 2, 3, . . . with the following characteristics:

$$b([kT]_\downarrow sym) = M \times sign(sin(2 \times \pi \times f_\downarrow p \times [kT]_\downarrow sym)), k=0,1,2,3,\ldots \quad \text{eq. 6}$$

Where, $$f_p = \frac{1}{T_p}$$

with $T_p \gg T_{sym}$; and
$T_p$ represents the period of the alternating +M, −M, +M, −M . . . pattern.

In one embodiment, the period $T_p$ of the alternating sequence $b(kT_{sym})$, is assigned such that the bandwidth of the pilot tone is maintained within a band of 30 kHz centered on the designated ATSC pilot position. It should be noted however that it is only important that the modulated pilot tone is maintained within a narrowband centered on the location of an Advanced Television Systems Committee (ATSC) pilot for a DTV broadcast.

As shown in FIG. 4, this modulating sequence for generating the pilot tone is passed to a simplified ATSC transmitter embodied in the pilot tone generator 20 or the wireless microphone receiver 42. The simplified ATSC transmitter includes a VSB modulator 80, which generates the vestigial sideband signal using the modulating sequence (+M, −M). A radio frequency (RF) up-converter 82 receives the output of the VSB modulator 80 and adds the output to a carrier frequency to up-convert it to the frequency of the TV Band channel assigned to the wireless microphone system. The up-converted signal is broadcast using an antenna 84.

In another embodiment of the invention, the pilot tone can be produced in either the analog or the digital domain and up-converted to the designated pilot frequency within the TV Band channel. As one example, a numerically-controlled oscillator (NCO) can be programmed to output a sine wave at the frequency $f_{IF}$. The output of the NCO is multiplied digitally by the +M, −M (+1, −1) sequence by a digital multiplier. The digital multiplier output is processed by a digital-to-analog converter (DAC) and subsequently up-converted in the analog domain to the designated pilot frequency within the TV Band channel assigned to the wireless microphone system.

Figure 5:
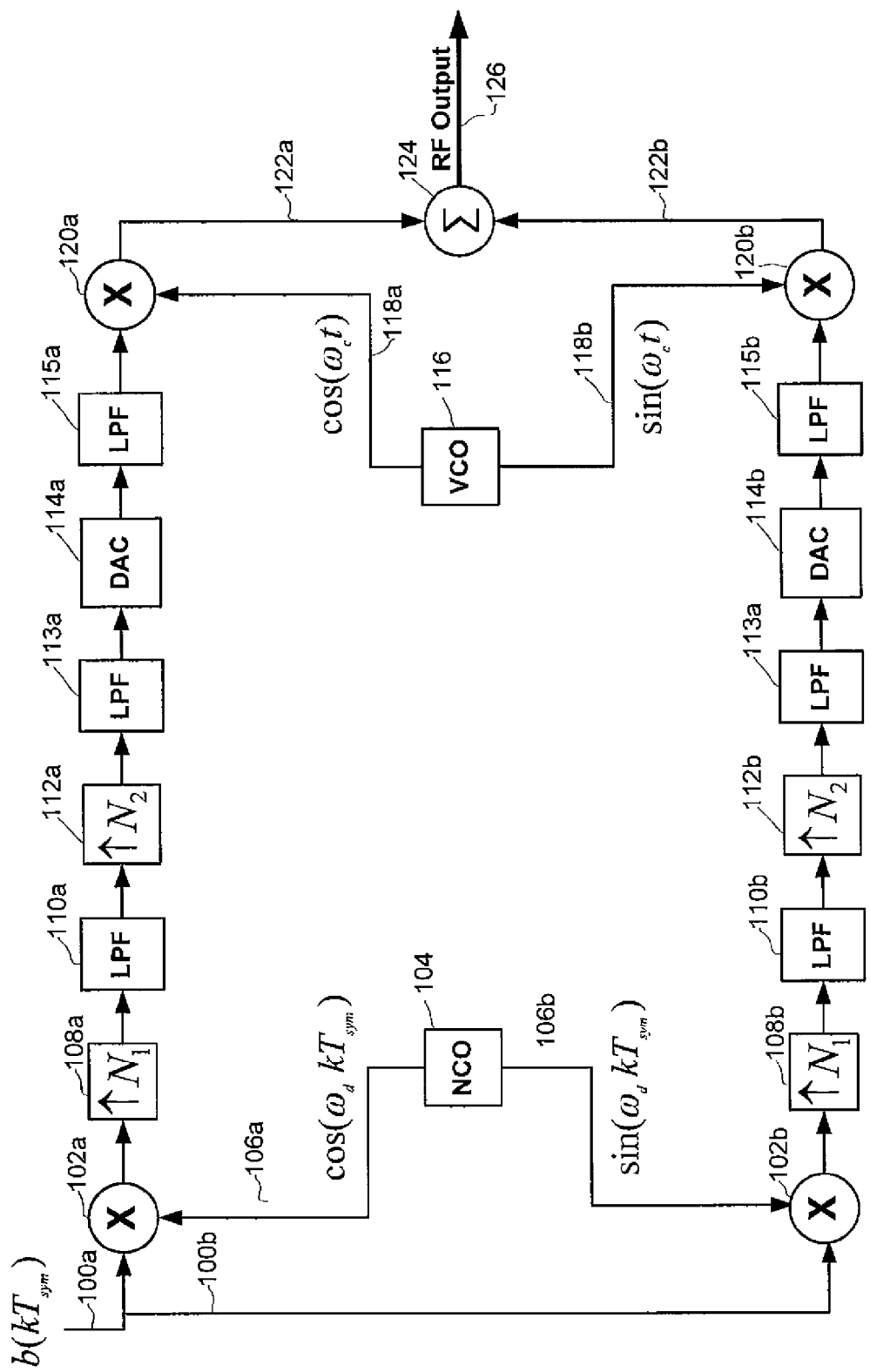
FIG. 5 is a schematic diagram illustrating an exemplary circuit for implementing the apparatus shown in FIG. 4.

FIG. 5 is a schematic diagram illustrating an exemplary circuit for implementing the apparatus shown in FIG. 4. The pilot tone is generated at the ATSC pilot position using the Weaver single side band generation technique. The modulating sequence $b(kT_{sym})$, k=0, 1, 2, 3, . . . is fed via respective signal lines 100a, 100b to respective digital signal multipliers 102a, 102b. The digital signal multiplier 102a multiplies the modulating sequence by a first output 106a of a numerically controlled oscillator (NCO) 104. The first output 106a of the signal generator 104 is represented by:

$$\cos(\omega_d k T_{sym}) \quad \text{eq. 7}$$

Where:

$$\omega_d = 2 \times \pi \times \frac{\text{ATSC\_Symbol\_Rate}}{4}$$

The signal multiplier 102b multiplies the modulating sequence by an output 106b of the NCO 104. The output 106b is represented by:

$$\sin(\omega_d k T_{sym}) \quad \text{eq. 8}$$

The outputs of the respective signal multipliers 102a and 102b are passed to respective up-sampling circuits 108a and 108b, which respectively up-convert the signals using an appropriate up-conversion ratio selected in a manner known in the art. In one embodiment the up-sampling ratio $N_1=2$. The respective signals are then passed to respective low pass filters (LPFs) 110a and 110b which respectively remove unwanted high frequencies from the respective up-sampled signals before they are passed to respective second up-sampling circuits 112a, 112b which up-convert the signals using a second up-sampling ratio $N_2$. In one embodiment, $N_2=4$. The up-converted signals are then passed to respective low pass filters 113a, 113b which remove unwanted high frequencies from the further up-sampled signals before they are passed to respective digital-to-analog (DAC) converters 114a, 114b which convert the respective digital signals to corresponding analog signals in a manner well known in the art. The respective analog signals are passed to respective low pass filters 115a, 115b to remove unwanted frequencies before they are passed to analog signal multipliers 120a, 120b. The analog signal multiplier 120a multiplies the analog signal by:

$$\cos(\omega_c t) \quad \text{eq. 9}$$

where: $\omega_c=2\times\pi\times f_c$, and $f_c$ is the center frequency of the DTV Band channel in use by the WM transmission system.

The analog signal multiplier 120b multiplies the analog signal by:

$$\sin(\omega_c t). \quad \text{eq. 10}$$

The output of the analog signal multiplier 120a is passed via 122a to an analog signal summer 124. The output of the analog signal multiplier 120b is passed via 122b to the analog signal summer 124. The analog signal summer 124 outputs the RF signal to the antenna 84 shown in FIG. 4.

Figure 6:
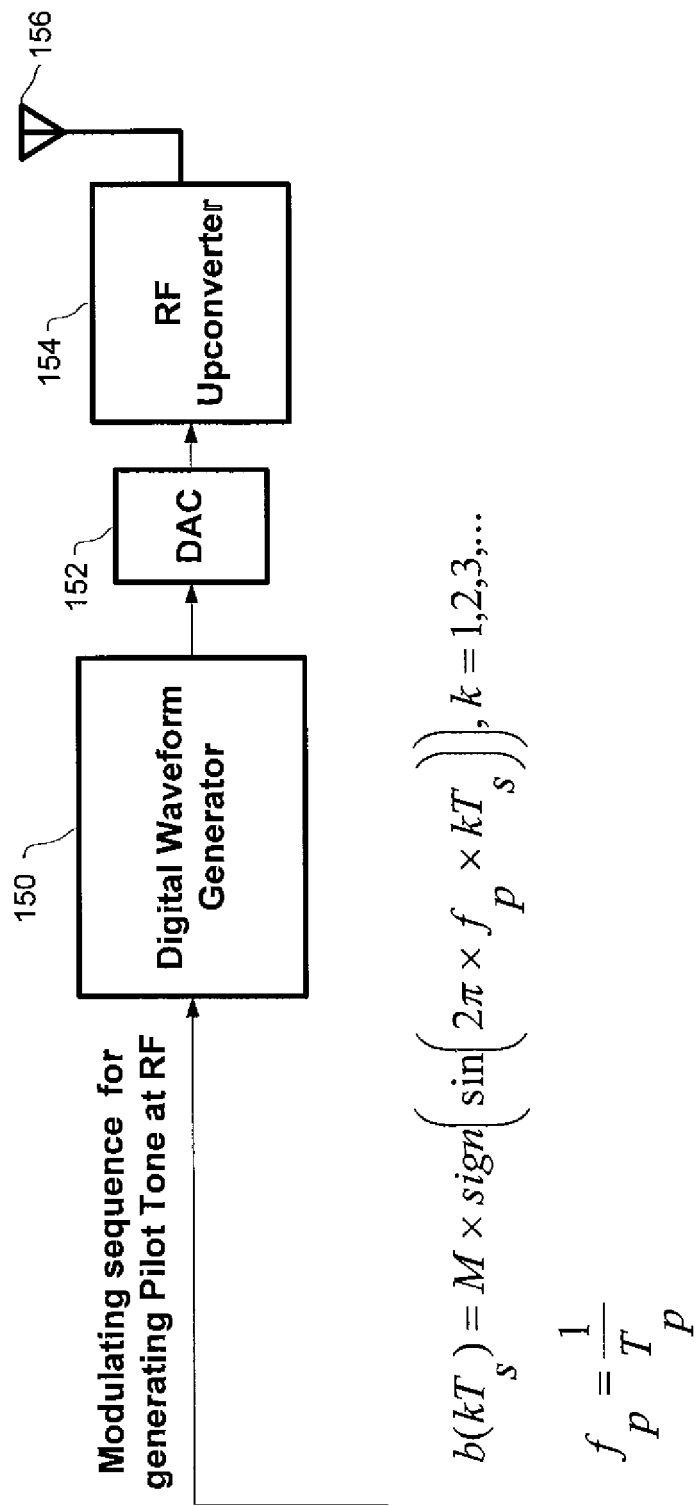
FIG. 6 is a schematic diagram illustrating an apparatus for generating the pilot tone at the ATSC pilot position in accordance with another embodiment of the invention.

FIG. 6 is a schematic diagram illustrating an apparatus for generating the pilot tone at the ATSC pilot position in accordance with another embodiment of the invention. As shown in FIG. 6, a modulating sequence $b(kT_s)$ is input to a digital waveform generator 150, which will be explained below with reference to FIG. 6. The modulating sequence $b(kT_s)$ is defined by:

$$b(kT_s)=M\times\text{sign}(\text{Sin}(2\lambda f_p k T_s)), k=0,1,2,3\ldots \quad \text{eq. 11}$$

Where:
$T_s$ is the sampling clock frequency of the digital waveform generator 150;

$$f_p = \frac{1}{T_p}$$

With $T_p \gg T_s$; and
$T_p$ represents the period of the alternating +M, −M, +M, −M . . . pattern.

The digital a waveform generator 150 outputs a sinusoidal tone that is phase-modulated by the alternating pattern +M, −M, +M, −M . . . pattern to a digital-to-analog converter (DAC) 152, which converts it to an analog wave that is passed to a radio frequency (RF) upconverter 154. The RF upconverter 154 up-converts the analog wave to a radio frequency signal that is broadcast using an antenna 156 in a manner known in the art.

Figure 7:
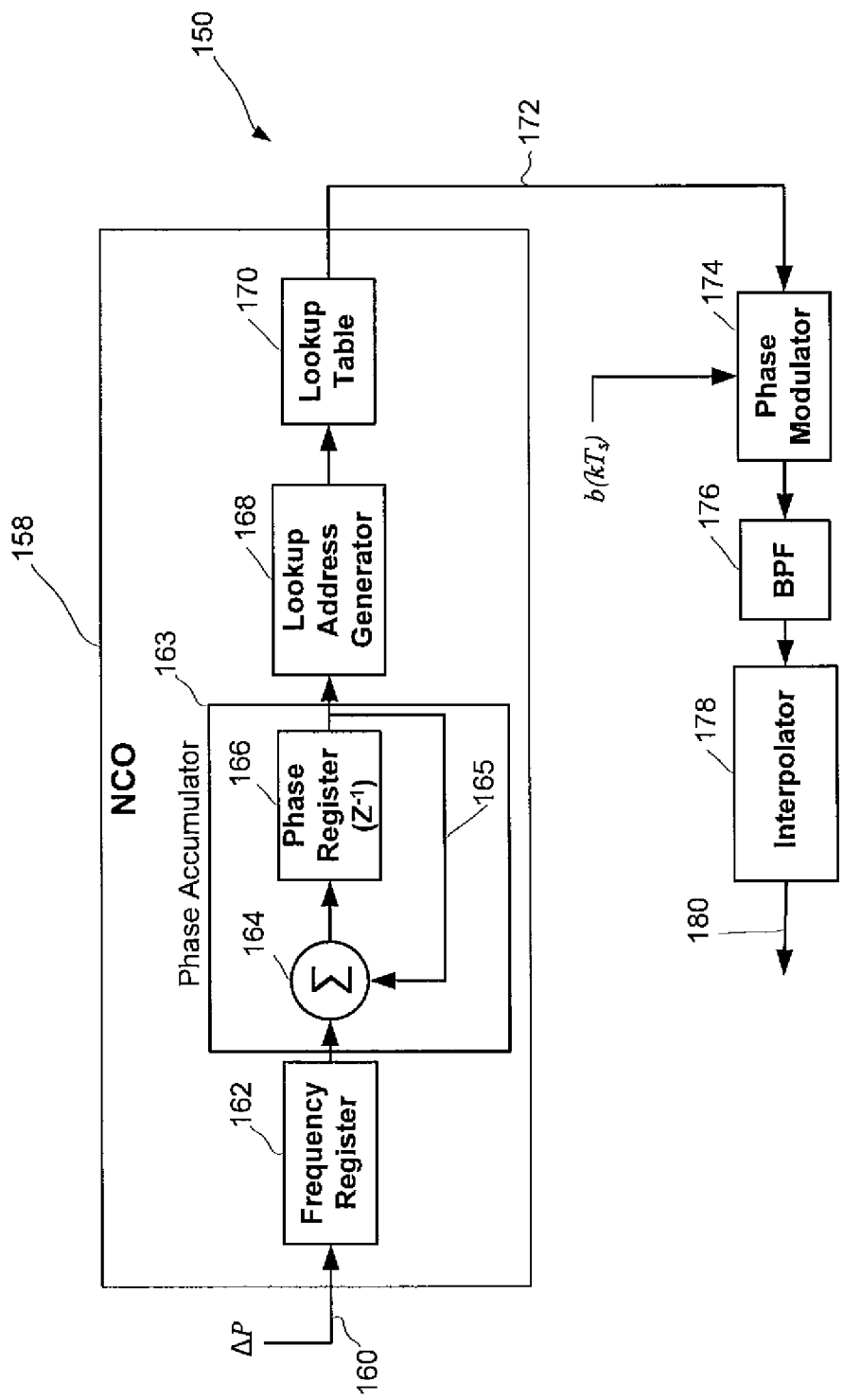
FIG. 7 is a schematic diagram illustrating an exemplary circuit for implementing the apparatus shown in FIG. 6.

FIG. 7 is a schematic diagram illustrating an exemplary circuit for implementing the digital waveform generator 150 shown in FIG. 6. A programmable value ΔP is input via 160 to a frequency register 162 of a numerically controlled oscillator (NCO) 150. ΔP is defined as:

$$\Delta P \frac{2^J \times f_1}{f_s} \quad \text{eq. 12}$$

Where:
$f_1$ is the frequency of a single tone that will be up-converted to the pilot tone;

$$f_s = \frac{1}{T_s};$$

and
J is typically ≥24

Output of the frequency register 162 is fed to a phase accumulator 163. The phase accumulator includes a digital summer 164 that adds the output (ΔP) to feedback 165 of a phase register 166, which introduces a 1-sample delay ($Z^{-1}$) to the output of the digital summer 164. The sum output by the digital summer wraps around when the sum exceeds a value of $2^J-1$. Consequently, the phase register 166 outputs a digital sawtooth waveform to a lookup address generator 168. The digital sawtooth waveform has a period $T_1$, where $$T_1 = \frac{1}{f_1}.$$

The digital sawtooth waveform is converted within the NCO 158 to a digital sine waveform using the lookup address generator 168, which generates lookup addresses for a lookup table 170. The lookup address generator 168 generates the lookup addresses, for example, by either truncating or rounding the output of the phase accumulator 163 to n bits, where, in one embodiment, n=12 or 14. The output of the lookup address generator 168 is used by the lookup table to convert the digital sawtooth waveform to the digital sine waveform, which is fed to a phase modulator 174. The digital sine wave is represented by:

$$\text{Sin}(2\pi f_1 k T_s), k=0,1,2,3\ldots \quad \text{eq. 13}$$

The phase modulator 174 multiplies the sine waveform input by the modulating sequence $(b(kT_s))$ to generate the modulating pilot tone, since both the sine waveform and $(b(kT_s))$ are sampled at the rate of $f_s$. Output of the phase modulator 174 is fed to a band pass filter 176 with a pass band of about 30 kHz. The filtered signal is conditioned for input to the DAC 152 (FIG. 6) by an interpolator 178, which performs a sampling rate conversion to convert the sampling rate of the output of the BPF 176 to a sampling frequency more suitable for the DAC 152. The conditioned signal is output via 180 to the DAC 152, which converts the digital signal to an analog signal as described above with reference to FIG. 6.

Figure 8:
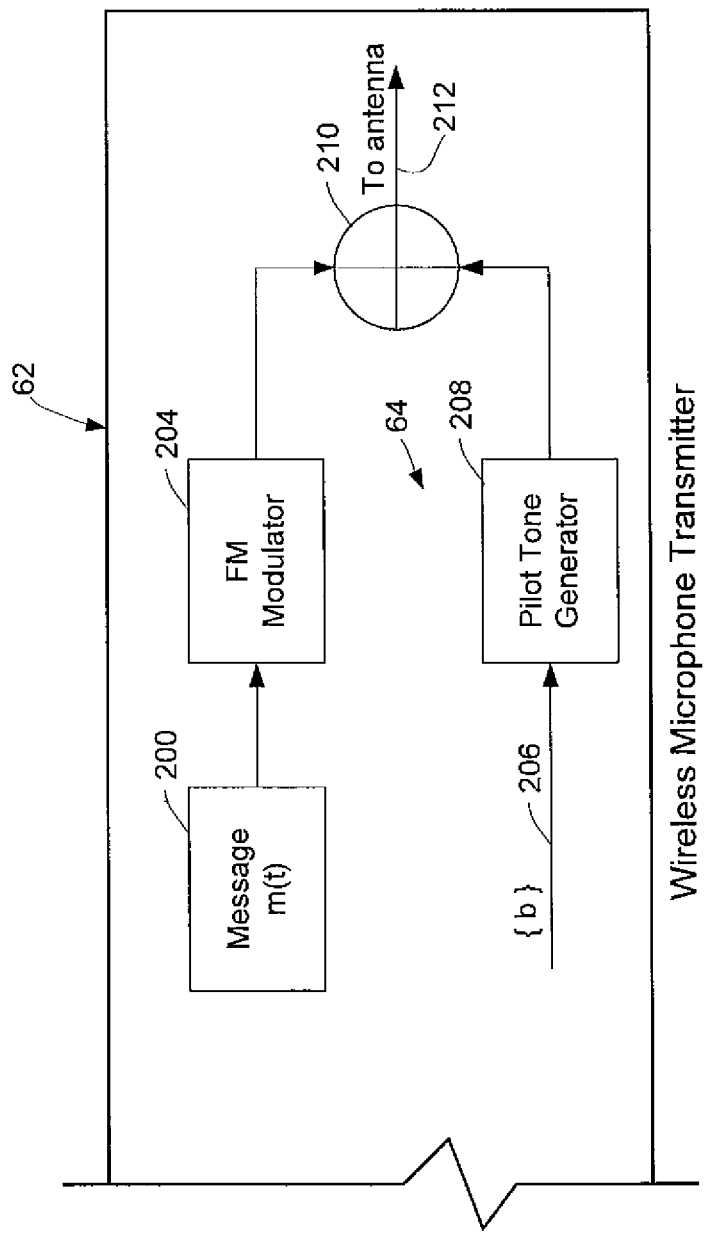
FIG. 8 is a schematic diagram illustrating certain components of a wireless microphone in accordance with one embodiment of the invention.

FIG. 8 is a schematic diagram illustrating certain components of the wireless microphone 62 shown in FIG. 3. A message module 200 converts wireless microphone input, in a manner well known in the art, to a time-sensitive message content (m(t)) in a message format used by the wireless microphone system 60 (FIG. 3). The message content is passed to an FM modulator 204, which sequentially converts each m(t) into an FM radio signal, also in a manner well known in the art. Simultaneously, the modulating sequence {b} is fed via 206 to a pilot tone generator 208, which may be implemented for example as described above with reference to FIGS. 4-7. Output of the FM modulator 204 and the pilot tone generator 208 are simultaneously passed to an analog signal summer 210, which outputs the combined pilot tone and FM RF signal to the antenna 68 (FIG. 3) of the wireless microphone 62.

Figure 9:
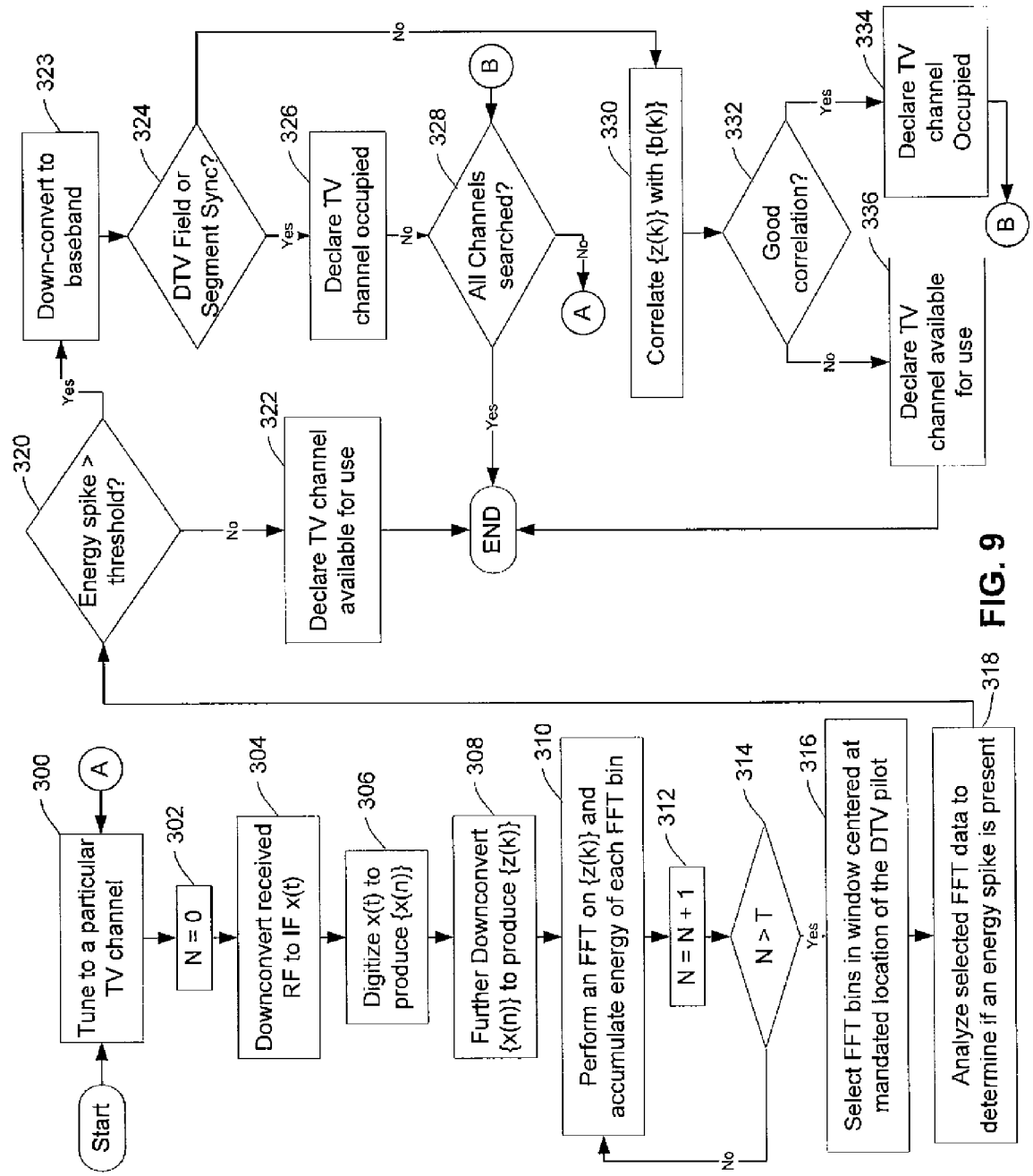
FIG. 9 is a flow chart illustrating a method of sensing TV Band channels in accordance with the invention to find a white space channel that is available for use by a TV Band device.

FIG. 9 is a flow chart illustrating a method of sensing TV Band channels in accordance with one embodiment of the invention to find a TV Band channel available for use by a TV Band device. In accordance with the method, the pilot sensor 34 of the TV Band device 32 (FIGS. 1-3) is tuned (300) to a particular TV Band channel. The particular TV Band channel may be selected in any number of ways, including reference to a database of TV Band channels known to be used by DTV broadcasters in a given geographical area, so that those channels can be excluded from the search. Once tuned to the particular TV Band channel, a counter "N" is initialized to zero (302). The received RF signal is then down converted (304) to an analog intermediate frequency (IF(x(t))) in a manner well known in the art. The analog IF(x(t)) is digitized (306) by an analog-to-digital converter (A/D) to produce a digital signal (x(n)). IF(x(t)) is sampled by the A/D at, for example, about a 100 MHz sampling rate, also in a manner well known in the art. The digital signal (x(n)) is further down converted/decimated (308) to produce {z(k)} at, for example, 5.38 MHz {z(k)} is then sampled at about 20 MHz and a 4096-bin Fast Fourier Transform (FFT) is performed (310) on the {z(k)} samples. The energies of the 4096 FFT bins are accumulated in 4096 registers in a manner well understood by those skilled in the art. The FFT bin size is about 4.88 kHz, i.e. 20 MHz/4096=4.88 kHz. The variable N is then incremented (312) by 1, and it is determined (314) if N is greater than a predetermined variable "T". In one embodiment of the invention, T=100. If not, the process returns to step 310, and the energy of each FFT bin is again accumulated as described above. When N>T, a predetermined number of FFT bins around the mandated frequency location of the DTV pilot are selected (316), and the data associated with the selected FFT bins is analyzed (318) to determine (320) if an energy spike is present that exceeds an energy spike threshold. The energy spike threshold may be a preset value. In one embodiment the energy spike threshold is set at 0.5 dB. Alternatively, the energy spike threshold may be dynamically established using, for example, a noise floor computed using the energy accumulated in a predetermined number of the FFT bins, an example of which will be explained below in more detail with reference to FIG. 8.

If it is determined (320) that the TV Band channel does not contain an energy spike that exceeds the energy spike threshold, the TV Band channel is declared (322) to be TV white space that is available for use, and the process ends. If it is determined at 320 that an energy spike that exceeds the energy spike threshold is present, the energy spike may be a spurious signal or the TV Band channel may be in use and further analysis is required. Consequently, the signal is further down-converted to baseband (323) and the baseband signal is examined in the time domain in a manner known in the art to determine whether the received signal contains a DTV Field-sync or a Segment-sync component, which are identifiable components of the baseband signal if the channel is in use by a DTV transmitter. If a DTV Field-sync and/or Segment-sync is identified, the TV Band channel is declared to be occupied (326) by a DTV broadcast, and it is determined (328) if all TV Band channels have been searched. If all TV Band channels have not been searched, the process returns to step 300 and the search resumes. Otherwise, the process ends.

If it was determined at step 324 that neither a DTV Field-sync nor a DTV Segment-sync signal were identified, {z(k)} is correlated with {b(k)} (330) and it is determined (332) if there is a good level of correlation between {z(k)} and {b(k)}. If there is a good level of correlation between {z(k)} and {b(k)}, the TV Band channel is declared (334) to be occupied by a wireless microphone system and the process returns to step 328. If not, it is assumed that the energy spike was a spurious signal, the TV Band channel is declared (336) to be available for use, and the process ends.

The energy spike threshold in accordance with the method described above with reference to 320 of FIG. 9 may be computed as described in applicant's co-pending U.S. patent application Ser. No. 12/543,259 filed on Aug. 18, 2009, the specification of which is incorporated herein by reference in its entirety.

Figure 10:
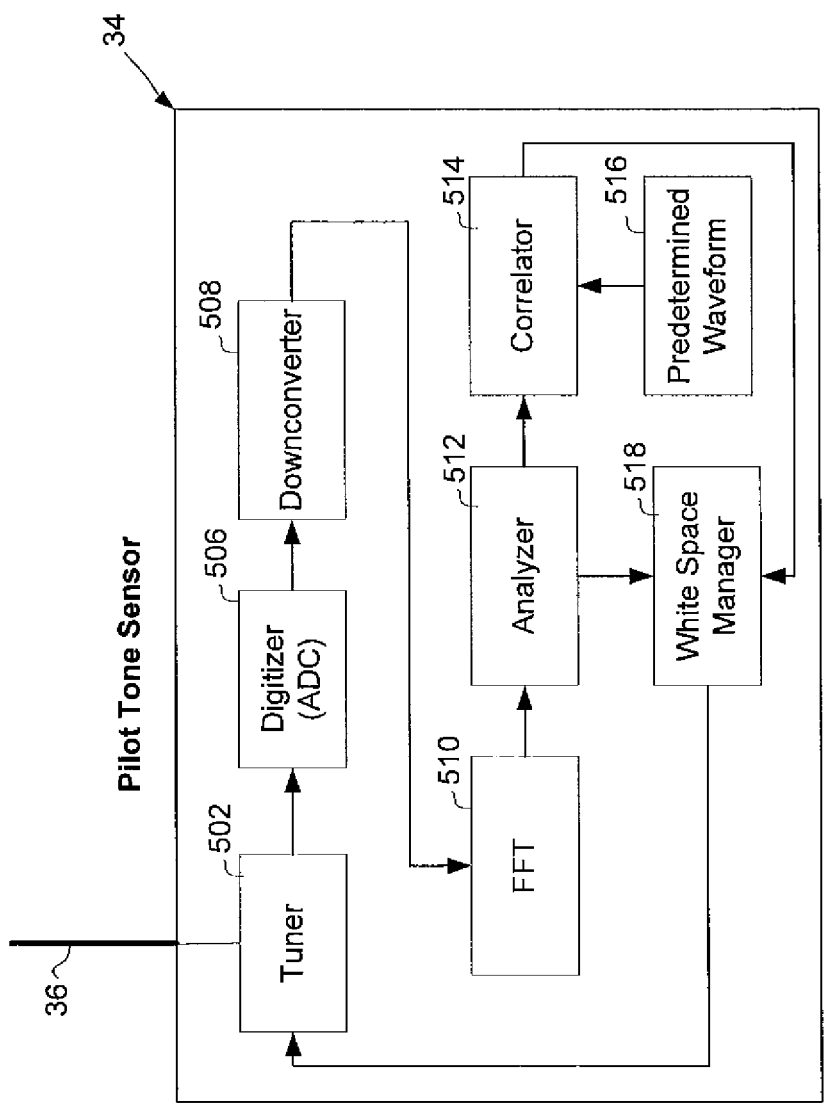
FIG. 10 is a schematic diagram of a pilot sensor of a TV Band device in accordance with one embodiment of the invention.

FIG. 10 is a schematic diagram of the pilot sensor 34 of the TV Band device 32 shown in FIGS. 1-3, in accordance with one embodiment of the invention. A tuner 502 connected to the antenna 36 tunes to a particular TV Band channel under the control of a white space manager 518, which selects the particular TV Band channel in accordance with a predetermined algorithm which is beyond the scope of this invention. The tuner 502 down-converts the 6 MHz TV signal to an intermediate frequency (IF) signal x(t), as explained above with reference to FIG. 9. The down-converted IF signal x(t) is passed to a digitizer 506, in this embodiment an analog-to-digital converter that converts the IF signal x(t) to a digital intermediate frequency IF signal x(n), which is passed to a downconverter 508. The downconverter 508 down-converts the IF signal x(n) to another intermediate frequency IF signal {z(k)}, which is passed to a Fast Fourier Transform (FFT) 510.

The FFT 510 transforms {z(k)} in a manner known in the art, and accumulates a predetermined number of transform results in FFT bins (not shown), which are well known in the art. Contents of the FFT bins are passed to an analyzer 512, which may be embodied in the white space manager 518. The analyzer 512 analyzes a predetermined number of the FFT bins centered at the ATSC pilot position to determine whether they contain the energy spike, as explained above with reference to FIG. 9. If so, the analyzer 512 further down-converts the IF to baseband and analyzes the baseband signal in the time domain to determine if an ATSC field-sync or segment-sync are present. All search results are reported to the white space manager 518. If the analyzer finds an energy spike at the ATSC pilot position, but does not find a field-sync or a segment-sync in $\{z(k)\}$, a correlator 514 is correlates $\{z(k)\}$ with the predetermined waveform known to be broadcast by wireless microphone systems. The correlator outputs correlation results to the white space manager 518, which makes a final determination about whether the particular TV Band channel is available white space, as described above with reference to FIG. 9.

Although the invention has been described above with reference to a wireless microphone system that generates a pilot tone using a modulating sequence, it should be understood that any readily recognizable waveform transmitted in the ATSC pilot position can be used for the same purpose.

It should therefore be noted that the embodiments of the invention described above are intended to be exemplary only. The scope of the invention is therefore intended to be limited solely by the scope of the appended claims.

We claim:

1. A method of determining whether a TV Band channel is available for use by a TV Band device, comprising:
   tuning to the TV Band channel;
   down-converting a radio frequency signal received on the TV Band channel to yield a down-converted signal;
   performing a predetermined number of Fast Fourier Transforms (FFTs) of the down-converted signal and accumulating an energy of respective bins associated with the respective FFTs;
   selecting a predetermined number of FFT bins centered at a mandated location of an Advanced Television Systems Committee (ATSC) pilot in the TV Band channel;
   analyzing the selected FFT bins to determine if an energy spike is present in any one of the selected FFT bins;
   if an energy spike is not present in any one of the selected FFT bins, declaring the TV Band channel available for use by the TV Band device; else
   further down-converting the radio frequency signal to a baseband signal and analyzing the baseband signal in the time domain to determine if the baseband signal contains a DTV field-sync or a DTV segment-sync; else
   correlating the baseband signal with a predetermined waveform known to be broadcast by wireless microphone sites, and if there is a good level of correlation, declaring the TV Band channel in use by a wireless microphone; else
   declaring the TV Band channel available for use by the TV Band device.

2. The method as claimed in claim 1 wherein the predetermined waveform is defined at baseband by the following modulating sequence:
$$\{b\}=\{+M,-M,+M,-M,+M,-M,+M\ldots\}$$

3. A TV Band device, comprising:
   a white space manager which selects a particular TV band channel;
   a tuner controlled by the white space manager to tune to the particular TV Band channel and receive a signal;
   a digitizer that digitizes the signal from the tuner to produce a digitized signal;
   a Fast Fourier Transform in communication with the digitizer which transforms the digitized signal;
   an analyzer which analyzes the transformed digitized signal to determine if the digitized signal contains an energy spike that exceeds a predetermined threshold and if an energy spike is not present, declaring the particular TV Band channel available for use by the TV Band device, else further analyzing the digitized signal in the time domain to determine if the digitized signal contains a DTV field-sync or a DTV segment-sync; and
   a correlator that correlates the digitized signal in the time domain with a predetermined waveform to determine whether the particular TV Band channel is in use by a wireless microphone system if the DTV field-sync and the DTV segment-sync were not identified.

4. The TV Band device as claimed in claim 3 further comprising:
   a first downconverter that down-converts a the signal received on the particular TV Band channel to an intermediate frequency and provides the down converted signal to the digitizer.

5. The TV Band device as claimed in claim 4 further comprising a second downconverter which down converts the digitized signal and provides the down converted digitized signal to the Fast Fourier Transform.

6. The TV Band device as claimed in claim 5 wherein the analyzer further comprises a third downconverter which further down converts the digitized signal to baseband signal.

7. The TV Band device as claimed in claim 6 wherein the white space manager receives information from the analyzer and the correlator and determines whether the particular TV Band channel is available for use by the TV Band device.

* * * * *